United States Patent
Kobayashi et al.

(10) Patent No.: US 7,460,973 B2
(45) Date of Patent: Dec. 2, 2008

(54) SENSING APPARATUS

(75) Inventors: Masayuki Kobayashi, Minamiawaji (JP); Shinichi Itagaki, Sumoto (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 0 days.

(21) Appl. No.: 11/808,817

(22) Filed: Jun. 13, 2007

(65) Prior Publication Data
US 2007/0290905 A1 Dec. 20, 2007

(30) Foreign Application Priority Data
Jun. 15, 2006 (JP) ............................. 2006-165986

(51) Int. Cl.
*G01K 7/16* (2006.01)
*H03M 1/00* (2006.01)

(52) U.S. Cl. ...................... 702/133; 341/126

(58) Field of Classification Search ............ 702/65, 702/116, 126, 130, 133; 341/126, 166; 363/41, 363/65
See application file for complete search history.

(56) References Cited

U.S. PATENT DOCUMENTS

| 5,737,630 | A  | * | 4/1998  | Kobayashi ............ 712/29 |
| 6,184,666 | B1 | * | 2/2001  | Boeckmann et al. ... 323/282 |
| 6,331,822 | B1 | * | 12/2001 | Sato et al. ............ 340/3.22 |

* cited by examiner

*Primary Examiner*—Bryan Bui
(74) *Attorney, Agent, or Firm*—Westerman, Hattori, Daniels & Adrian, LLP.

(57) ABSTRACT

A sensing apparatus includes a microprocessor having an A/D converting function of digital-converting an analog electric quantity supplied to an A/D conversion port and taking in a conversion result, and a plurality of electrical elements that are connected with the microprocessor and generate analog electric quantities. The plurality of electrical elements are respectively connected with a plurality of switch ports in the microprocessor that can be selectively grounded by internal switches of the microprocessor. Analog electric quantities generated in the electrical elements can be selectively taken into the A/D converting function of the microprocessor by selectively switching the internal switches.

5 Claims, 4 Drawing Sheets

-PRIOR ART-

-PRIOR ART-

SENSING APPARATUS

BACKGROUND OF THE INVENTION

1. Field of the Invention

The present invention relates to a sensing apparatus including a microprocessor having an A/D converting function of digital-converting an analog electric quantity supplied to an A/D conversion port to take in a conversion result, and a plurality of electrical elements that are connected with the microprocessor and generate analog electric quantities.

2. Description of the Related Art

In recent years, a microprocessor (an IC) having an A/D converting function has been developed. This type of microprocessor digital-converts an analog electric quantity (a voltage) given to an A/D conversion port thereof and takes in a conversion result. For example, the microprocessor is used when temperature information (an analog voltage value) detected by a thermistor (a temperature sensing element) is inputted to the microprocessor and the microprocessor performs various kinds of controls based on this temperature information.

As a specific example, FIG. 3 shows a charge/discharge controller that detects terminal voltages V1, V2, and V3 and a charge/discharge current I of a plurality of battery cells constituting a secondary battery BAT to control charge/discharge of the secondary battery BAT. In this charge/discharge controller, a battery temperature of each battery cell is detected by using a thermistor T, and the detected temperature information is used to perform correction of battery characteristics when executing the charge/discharge control or an operation of a protection circuit for the secondary battery BAT. As a main control section in such a charge/discharge controller, the above-explained microprocessor is used.

It is to be noted that, in this charge/discharge controller, temperatures of various kinds of electronic components mounted on a printed circuit board are detected and operation characteristics or operation compensating temperatures of the electronic components, e.g., a charge/discharge control transistor or a current detection resistor are also monitored in accordance with the detected temperatures.

Meanwhile, in a case where temperature information (analog voltage values) detected by each of a plurality of thermistors (temperature sensing elements) is inputted to the microprocessor, it is general that the plurality of thermistors (the temperature sensing elements) are respectively connected with a plurality of A/D conversion ports of the microprocessor as shown in FIG. 4. Specifically, fixed resistors R1 and R2 are respectively connected with two thermistors T1 and T2 in series, and a constant direct-current voltage V outputted from an output port of an analog circuit A is applied to each of these series circuits, thereby driving the respective thermistors T1 and T2. Further, voltages (output voltages from the thermistors) divided by the thermistors T1 and T2 whose resistance values vary depending on a temperature and the fixed resistors R1 and R2 are respectively inputted to two A/D conversion ports of a microprocessor M through filter circuits F1 and F2.

However, when taking temperature information detected by each of the plurality of thermistors T into the microprocessor M in this manner, the plurality of fixed resistors R and filter circuits F must be respectively provided in accordance with the number of the thermistors T, and the number of the A/D conversion ports of the microprocessor M must be also increased. Therefore, the structure is compulsively complicated.

SUMMARY OF THE INVENTION

The present invention is achieved in view of the above circumstances. It is an object of the present invention to provide a sensing apparatus having a simple structure that can effectively take an analog electric quantity (a voltage), e.g., temperature information obtained by each of a plurality of thermistors into a microprocessor without causing complication of the structure and an increase in the number of components.

An aspect of the present invention is directed to a sensing apparatus including a microprocessor that has an AD converting function of digital-converting an analog electric quantity supplied to an A/D conversion port and taking in a conversion result, and a plurality of electrical elements that are connected with the microprocessor and generate analog electric quantities, the sensing apparatus comprising: a plurality of internal switches provided in the microprocessor; and a plurality of switch ports that are provided in the microprocessor and can be selectively grounded by the internal switches, wherein said plurality of electrical elements are respectively connected with the plurality of switch ports, and analog electric quantities generated in the electrical elements can be selectively taken into the A/D converting function of the microprocessor by selectively switching the internal switches.

According to the thus configured sensing apparatus, just selectively grounding one of a plurality of switch ports by using an internal switch of the microprocessor enables driving one of a plurality of electrical elements (e.g., temperature sensing elements; thermistors). Therefore, an analog electric quantity (e.g., a voltage) generated in this electrical element (e.g., the temperature sensing element; the thermistor) can be effectively taken into an A/D converting function of the microprocessor. Accordingly, fixed resistors, filter circuits or the like do not have to be prepared in accordance with the number of the electrical elements (e.g., the temperature sensing elements; the thermistors). Consequently, it is possible to reduce the number of components and simplify a circuit configuration. Furthermore, it is possible to obtain effects, such as a reduction in the number of A/D conversion ports in the microprocessors to achieve simplification of the structure.

BRIEF DESCRIPTION OF THE DRAWINGS

The present invention will become more fully understood from the detailed description given hereinafter and the accompanying drawings which are given by way of illustration only, and thus, are not limitative of the present invention, and wherein.

DETAILED DESCRIPTION OF THE INVENTION

A sensing apparatus according to embodiments of the present invention will now be explained hereinafter with reference to the accompanying drawings. In these embodiments, two temperature sensing elements (thermistors) T1 and T2 are used to respectively detect temperatures in different regions, and temperature information (voltage values produced in the thermistors) is taken into a microprocessor M.

Figure 1:
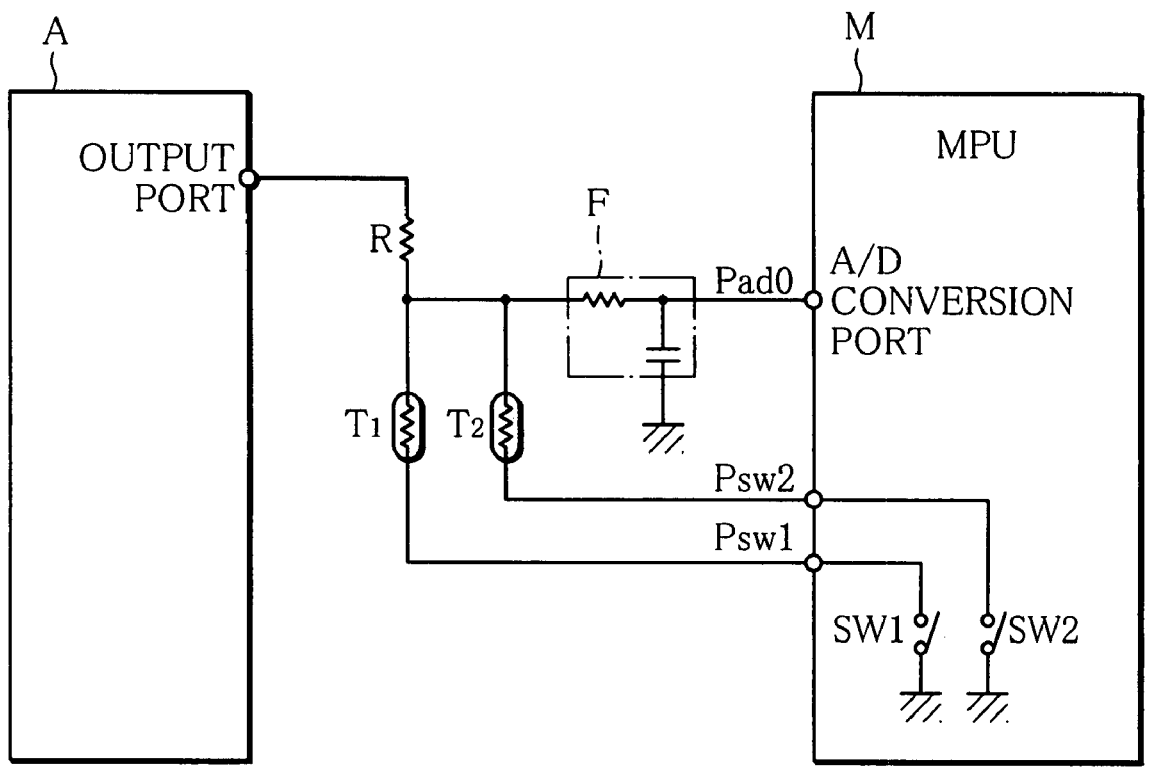
FIG. 1 is a schematic diagram showing a primary part of a sensing apparatus according to a first embodiment of the present invention.

FIG. 1 is a schematic diagram showing a primary part of a sensing apparatus according to a first embodiment of the present invention. Reference characters T1 and T2 denote thermistors as electrical elements that produce analog electric quantities, and each of these thermistors has a first end portion and a second end portion. The first end portions of these two thermistors T1 and T2 are commonly connected (a common connection point). When a constant voltage (e.g., a power supply voltage) V outputted from an analog circuit A is applied to the common connection point (the first end portion side of each of the thermistors T1 and T2) via a fixed resistor R, a driving power can be supplied to each of the thermistors T1 and T2. Further, the commonly connected first end portion side of each of the thermistors T1 and T2 is connected with an A/D conversion port Padc of a microprocessor M via a filter circuit F. Furthermore, the second end portions of the respective thermistors T1 and T2 are connected with two switch ports Psw1 and Psw2 of the microprocessor M.

The A/D conversion port Padc of the microprocessor M has an A/D converting function of digital-converting an analog voltage applied to the A/D conversion port Padc and taking in the conversion result. Moreover, the two switch ports Psw1 and Psw2 of the microprocessor M can be selectively grounded by using internal switches SW1 and SW2.

It is to be noted that the microprocessor M is mainly constituted of an arithmetic processing section (not shown). This arithmetic processing section executes arithmetic/comparison processing with respect to various kinds of processing data in accordance with previously programmed software, and outputs a result of the processing. Consequently, the arithmetic processing section executes charge/discharge control over, e.g., a secondary battery. In particular, this microprocessor M is configured to have a function of selectively turning on/off the switches SW1 and SW2 as well as the A/D converting function of taking in information inputted through the A/D conversion port Padc.

According to the thus configured sensing apparatus, when the constant voltage V is outputted from the output port of the analog circuit A, the internal switch SW1 is allowed to enter an electrically conductive state (turned on) so that the switch port Psw1 is grounded, and the internal switch SW2 is cut off (turned off) so that the switch port Psw2 is opened. As a result, a current flows through the thermistor T1 alone, thereby driving the thermistor T1. Consequently, the voltage V applied from the output port is divided by the thermistor T1 and the fixed resistor R. A divided voltage (an output from the thermistor T1) that is obtained in this way is inputted to the A/D conversion port Padc through the filter circuit F. Contrary, when the constant voltage V is outputted from the output port of the analog circuit A, the internal switch SW2 is allowed to enter an electrically conductive state (turned on) so that the switch port Psw2 is grounded, and the internal switch SW1 is cut off (turned off) so that the switch port Psw1 is opened. As a result, a current flows through the thermistor T2 alone, thereby driving the thermistor T2. Consequently, the voltage V applied from the output port is divided by the thermistor T2 and the fixed resistor R. A divided voltage (an output from the thermistor T2) that is obtained in this way is inputted to the A/D conversion port Padc through the filter circuit F.

Therefore, even if the microprocessor M is provided with the single A/D conversion port Padc alone, outputs from the two thermistors can be selectively taken into the microprocessor M by just performing selective switching control over the internal switches SW1 and SW2. Additionally, since the first end portion sides of the two thermistors T1 and T2 are commonly connected, by using one fixed resistor R and one filter circuit F alone, the thermistors T1 and T2 can be selectively driven and outputs from the thermistors T1 and T2 can be selectively taken into the microprocessor M. As a result, the number of constituent components in the sensing apparatus can be reduced, and the structure of the sensing apparatus can be simplified.

It is to be noted that, when using three or more thermistors T1 and T2 to Tn, it is sufficient to prepare switch ports Psw1 and Psw2 to Pswn in accordance with the number of the thermistors. In this case, likewise, the structure of the sensing apparatus can be further simplified as compared with an example where the sensing apparatus is realized by using the microprocessor M including the plurality of A/D conversion ports Padc each having the A/D converting function. Therefore, this configuration is very preferable in light of reducing a manufacture cost of the sensing apparatus.

Figure 2:
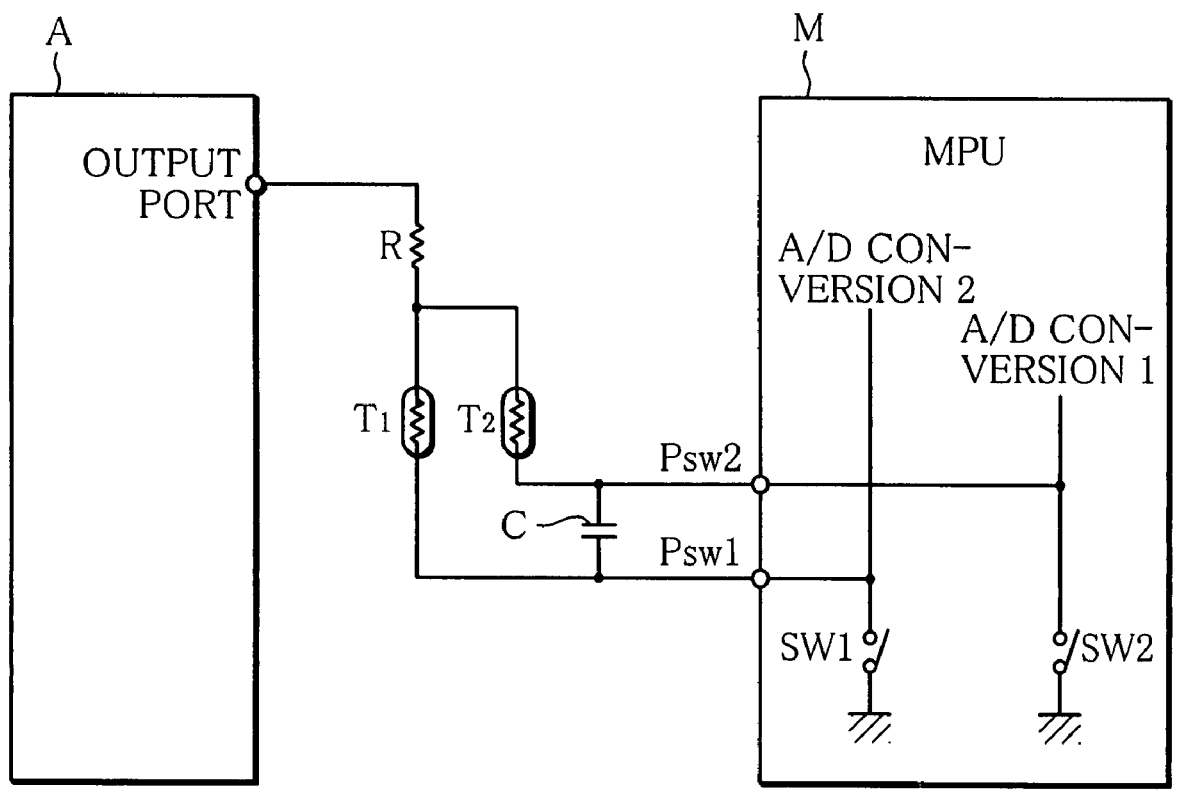
FIG. 2 is a schematic diagram showing a primary part of a sensing apparatus according to a second embodiment of the present invention.
Figure 3:
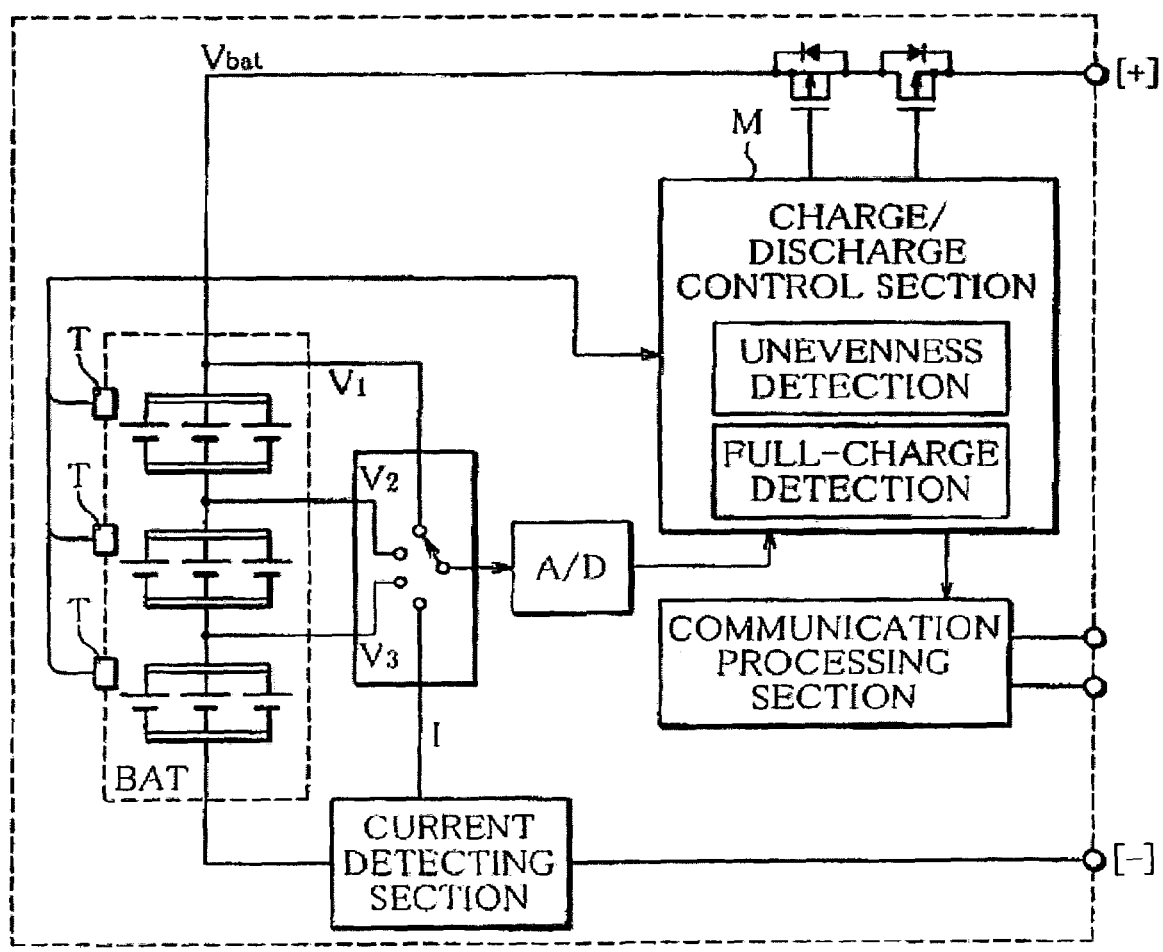
FIG. 3 is a diagram showing an example of a charge/discharge controller of a secondary battery having a sensing apparatus incorporated therein.
Figure 4:
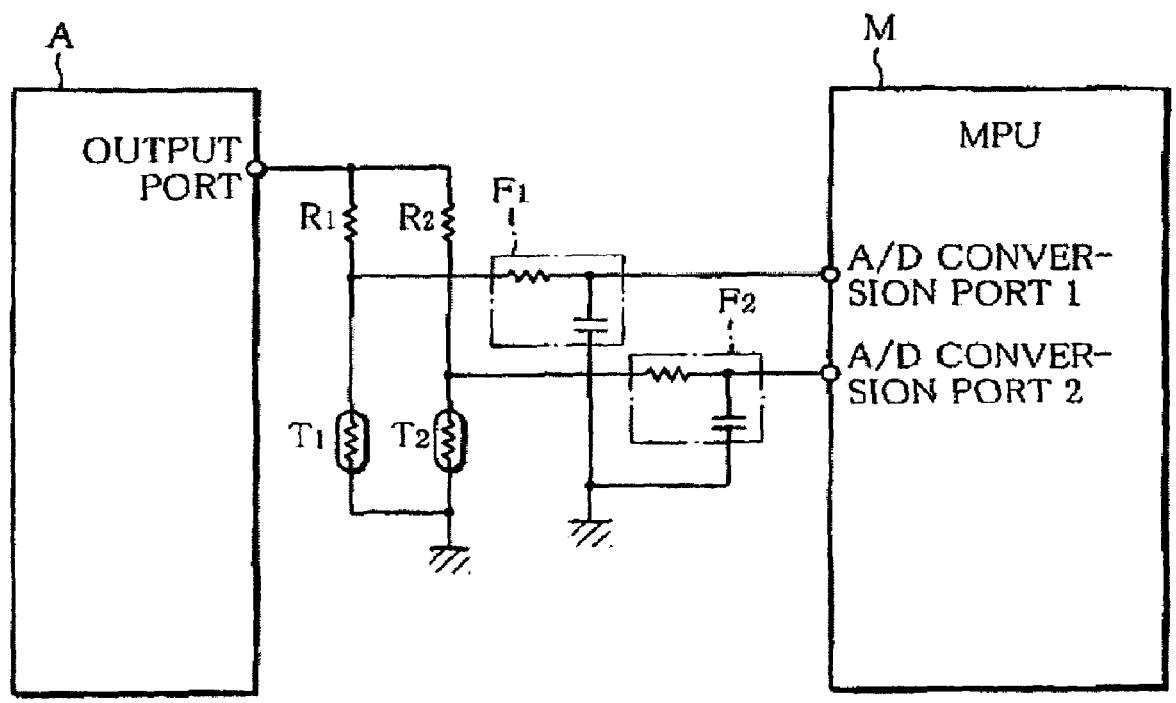
FIG. 4 is a schematic diagram of a primary part in a conventional sensing apparatus.

FIG. 2 shows a sensing apparatus as a second embodiment of the present invention, in which a plurality of switch ports Psw included in a microprocessor M also respectively serve as A/D conversion ports Padc. These switch ports Psw have a function as a multiplexer. That is, when one of internal switches SW respectively connected with these switch ports Psw is selectively turned on/off, one of the plurality of switch ports Psw is selectively connected with an input line of an A/D converting function of the microprocessor M.

When using the thus configured microprocessor M, like the first embodiment, first end portions of two thermistors T1 and T2 that are commonly connected are connected with an output port of an analog circuit A through one fixed resistor R. Second end portions of the thermistors T1 and T2 are respectively connected with the switch ports Psw1 and Psw2 of the microprocessor M, and a capacitor C as a filter is connected between these switch ports Psw1 and Psw2. Further, when a voltage is applied to the thermistors T1 and T2 from the output port of the analog circuit A through the fixed resistor R, a driving power can be supplied to the thermistors T1 and T2.

According to the thus configured sensing apparatus, when a constant voltage V is outputted from the output port of the analog circuit A, the internal switch SW1 is allowed to enter an electrically conductive state (turned on) so that the switch port Psw1 is grounded, and the internal switch SW2 is cut off (turned off) so that the switch port Psw2 is opened. As a result, a current flows through the thermistor T1 alone. Furthermore, the voltage V applied from the output port is divided by the thermistor T1 and the fixed resistor R. However, since the switch port Psw1 is grounded as explained above, the voltage generated in the thermistor T1 is not applied to the switch port Psw1. The voltage (an output voltage of the thermistor T1) divided by the fixed resistor R and the thermistor T1 is applied to the other switch port Psw2 through a filter circuit F constituted of the thermistor T2 and the capacitor C. Consequently, the output voltage of the thermistor T1 is taken into the microprocessor M through the switch port Psw2.

Contrary, when the constant voltage V is output from the output port of the analog circuit A, the internal switch SW2 is allowed to enter an electrically conductive state (turned on) so that the switch port Psw2 is grounded, and the internal switch SW1 is cut off (turned off) so that the switch port Psw1 is opened. As a result, a current flows through the thermistor T2 alone. In this case, a voltage divided by the fixed resistor R and the thermistor T2 (an output voltage of the thermistor T2) is applied to the switch port Psw1 through the filter circuit F constituted of the opened thermistor T1 and the capacitor C. Consequently, the output voltage of the thermistor T2 is taken into the microprocessor M through the switch port Psw1.

Therefore, when each of the plurality of switch ports Psw1 and Psw2 provided in the microprocessor M also serves as the A/D conversion port Padc, outputs from the two thermistors T1 and T2 can be selectively taken into the microprocessor M by just selectively turning on/off the internal switches SW1 and SW2 connected with these switch ports Psw1 and Psw2. Furthermore, in this case, since the first end portion sides of the two thermistors T1 and T2 are commonly connected, providing the single fixed resistor R alone can suffice. Moreover, since the thermistor T on the opened side and the capacitor C are used to configure the filter circuit F, the number of constituent components in the sensing apparatus can be reduced, and the structure of the sensing apparatus can be simplified.

It is to be noted that, when using three or more thermistors T1 and T2 to Tn, it is sufficient to prepare the microprocessor including the switch ports Psw1 and Psw2 to Pswn in accordance with the number of the thermistors. In this case, one of the internal switches SW respectively connected with these switch ports Psw1 and Psw2 to Pswn is grounded, and the remaining internal switches SW are opened. In such a state, it is good enough to configure the sensing apparatus in such a manner that an output from the thermistor T connected with the grounded switch port Psw can be taken in from one of the switch ports Psw except the grounded switch port Psw. In this case, however, the A/D converting function corresponding to each of the plurality of switch ports Psw is required, although the number of the ports in the microprocessor M can be reduced. Therefore, it can be said that such a configuration is actually preferable when using the two thermistors T1 and T2.

It is to be noted that the present invention is not restricted to the foregoing embodiments. The examples using the thermistors as electrical elements that produce analog electric quantities have been explained here. However, the present invention can be likewise applied to an example where outputs (analog electric quantities) from other sensing elements are taken into the microprocessor. Moreover, it is needless to say that the sensing apparatus according to the present invention can be applied to not only the charge/discharge control circuit of a secondary battery but also various kinds of control circuits. Besides, the present invention can be modified and carried out in many ways without departing from the spirit of the invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A sensing apparatus including a microprocessor that has an AD converting function of digital-converting an analog electric quantity supplied to an A/D conversion port and taking in a conversion result, and a plurality of electrical elements that are connected with the microprocessor and generate analog electric quantities, the sensing apparatus comprising:

a plurality of internal switches provided in the microprocessor; and a plurality of switch ports that are provided in the microprocessor and can be selectively grounded by the internal switches, wherein said plurality of electrical elements are respectively connected with the plurality of switch ports, and analog electric quantities generated in the electrical elements can be selectively taken into the A/D converting function of the microprocessor by selectively switching the internal switches.

2. The sensing apparatus according to claim 1, further comprising:

a fixed resistor having one end to which a constant voltage is applied and the other end connected with a first end portion of each of the plurality of temperature sensing elements, wherein the plurality of electrical elements are temperature sensing elements whose resistance values vary depending on a temperature;

the plurality of switch ports are provided independently from the A/D conversion port;

a connection point between the fixed resistor and the plurality of temperature sensing elements is connected with the A/D conversion port; and second end portions of the respective temperature sensing elements are individually connected with the plurality of switch ports.

3. The sensing apparatus according to claim 2, wherein the connection point between the fixed resistor and the plurality of temperature sensing elements is connected with the A/D conversion port through a filter.

4. The sensing apparatus according to claim 1, further comprising:

a fixed resistor having one end to which a constant voltage is applied and the other end connected with a first end portion of each of the plurality of temperature sensing elements, wherein the plurality of electrical elements are temperature sensing elements whose resistance values vary depending on a temperature;

the plurality of switch ports also serve as the A/D conversion port; and second end portions of the respective temperature sensing elements are individually connected with the plurality of switch ports.

5. The sensing apparatus according to claim 4, further comprising:

a capacitor connected between the plurality of switch ports, wherein an analog electric quantity of the temperature sensing element connected with the switch port grounded by the internal switches is inputted to a non-grounded switch port through a filter constituted of the capacitor and the temperature sensing element connected with the non-grounded switch port.

* * * * *